United States Patent
Beseth et al.

(10) Patent No.: US 7,042,710 B1
(45) Date of Patent: May 9, 2006

(54) MOUNTING SYSTEM FOR ELECTRONIC COMPONENTS

(75) Inventors: Jeffrey L. Beseth, Raymore, MO (US); Daniel J. Cool, Overland Park, KS (US); Stephen M. Reid, Olathe, KS (US)

(73) Assignee: Garmin Ltd., (KY)

( * ) Notice: Subject to any disclaimer, the term of this patent is extended or adjusted under 35 U.S.C. 154(b) by 111 days.

(21) Appl. No.: 10/458,477

(22) Filed: Jun. 10, 2003

(51) Int. Cl.
*H05K 5/00* (2006.01)

(52) U.S. Cl. .................. 361/679; 361/759; 439/628; 312/223.2

(58) Field of Classification Search ........ 361/679–687, 361/724–727, 730, 714, 753–754, 759, 746, 361/801; 439/628, 638, 928.1; 248/681; 312/223.2–223.3
See application file for complete search history.

(56) References Cited

U.S. PATENT DOCUMENTS

| | | | | |
|---|---|---|---|---|
| 5,818,696 A * | 10/1998 | Knoop | ........................ | 361/685 |
| 6,317,334 B1 * | 11/2001 | Abruzzini et al. | ........... | 361/797 |
| 6,356,441 B1 * | 3/2002 | Claprood | ..................... | 361/685 |
| 6,552,915 B1 * | 4/2003 | Takahashi et al. | ........... | 361/796 |
| 6,560,114 B1 * | 5/2003 | Berry et al. | ................. | 361/727 |

* cited by examiner

*Primary Examiner*—Hung Van Duong
(74) *Attorney, Agent, or Firm*—David L. Terrell

(57) ABSTRACT

A mounting system for electronic equipment is described which includes a mounting rack, a connector plate, and a retention device. The connector plate is hingedly mounted to a rear of the mounting rack and the connector plate is configured for the mounting of connectors that mate with the connectors of the electronic equipment. The retention device is configured to hold the connector plate against a rear of the mounting plate.

23 Claims, 5 Drawing Sheets

MOUNTING SYSTEM FOR ELECTRONIC COMPONENTS

RELATED APPLICATIONS

The present application is related to the following co-pending, commonly assigned U.S. patent applications: "System and Method for Mounting Units for an Avionic Display", Ser. No. 10/086,483, filed Feb. 28, 2002; "Slide-In Connector Plate for Avionic Unit Rack", Ser. No. 10/086, 568, filed Feb. 28, 2002; and "Electronic Equipment Module Mounting Apparatus and Method", Ser. No. 10/293,192, filed Nov. 12, 2002.

BACKGROUND OF THE INVENTION

This invention relates generally to mounting of electronic equipment. More specifically, embodiments of the invention relate to a mounting rack for electronic equipment which allows ease of installation within a mounting frame, and which allows insertion and removal of electronic equipment installed within the mounting racks to and from the mounting frame without use of tools.

The amount and types of electronic equipment available to consumers has proliferated at an extraordinary rate. One such example is in the aviation industry. Instrumentation, sensors, and other electronic equipment within aircraft, collectively referred to as avionics, are increasingly integrated. The result is that avionics within an aircraft can be customized for a user, by combining multiple "off the shelf" individual avionics devices. Such a customization approach to aircraft avionics installations can be best referred to as modularization of avionics equipment.

Modularization has however resulted in installation problems within individual aircraft, based on the space constraints therein. For example, it is sometimes difficult to access both a front and a rear of an individual piece of avionics equipment. Typically the rear of a piece of avionics equipment is where electrical connectors are located which provide the interfaces needed to communicate between the distinct avionics systems. These connectors mate with mating connectors which are hardwired into the wiring of the aircraft. Conversely, a front of the individual piece of avionics equipment is where indicators, lights, and other human interfaces are located. In some known aircraft installations, maintenance personnel are required to utilize special tools to access the rear connector area to attach or remove avionics to or from their respective mating connectors.

It would be advantageous to provide an electrical equipment mounting system that allows installation of equipment to mating connectors without having to utilize tools specifically designed and purchased for such a purpose.

BRIEF DESCRIPTION OF THE INVENTION

In one embodiment of the present invention a mounting system for electrical equipment is provided. The mounting system comprises a mounting rack, a connector plate hingedly mounted to a rear of the mounting rack, and a retention device configured to hold the connector plate against a rear of the mounting plate. The connector plate is utilized for the mounting of connectors that mate with the connectors of the electronic equipment.

In another embodiment of the present invention, a connector plate is provided which comprises a first end comprising one or more tabs extending therefrom, a second end comprising an extension extending therefrom, and a body portion extending between the first end and the second end. The body portion comprises a channel formed therein that is configured to engage a retention device.

In still another embodiment of the present invention, a mounting rack for electrical equipment is provided. The mounting rack comprises a base portion and two side portions extending from the body portion at a substantial right angle, one side portion comprising an opening approximate a rear of the side portion for engaging an extension extending from a first end of a connector plate, the other side portion comprising one or more slots approximate a rear of the side portion for engaging tabs extending from a second end of the connector plate. The mounting rack further comprises two channel forming portions extending from the side portions at a substantial right angle and a retention device attached to the mounting rack. The retention device is configured to engage the connector plate to hold the connector plate against the rear of the mounting rack.

BRIEF DESCRIPTION OF THE DRAWINGS

The objects and features of the invention noted above are explained in more detail with reference to the drawings which form a part of the specification and which are to be read in conjunction therewith, and in which like reference numerals denote like elements in the various views. The objects and features of the invention noted above are explained in more detail with reference to the drawings, in which like reference numerals denote like elements. In the accompanying drawings which form a part of the specification and which are to be read in conjunction therewith and in which like reference numerals are used to indicate like parts in the various views.

DETAILED DESCRIPTION OF THE INVENTION

Figure 1:
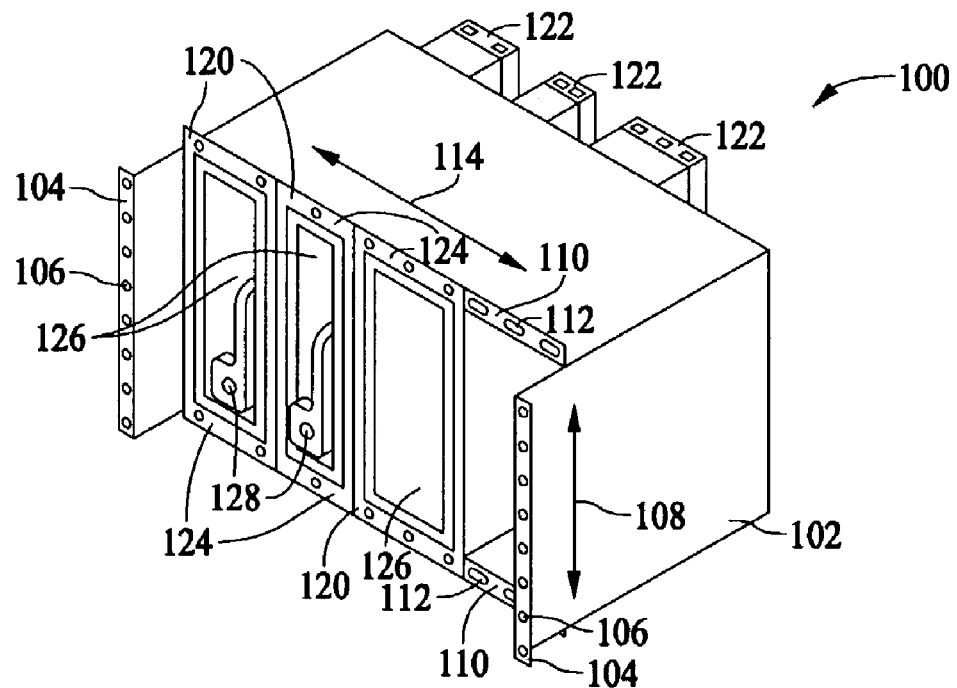
FIG. 1 is an isometric view of a mounting system for electronic equipment according to one embodiment of the present invention, including electronic equipment mounted therein.

In the following detailed description, reference is made to the accompanying drawings which form a part hereof, and in which is shown, by way of illustration, specific embodiments in which the invention can be practiced. In the drawings, like numerals describe substantially similar components throughout the several views. These embodiments are described in sufficient detail to enable those skilled in the art to practice the invention. Other embodiments can be utilized and structural, logical, and electrical changes can be made without departing from the scope of the present invention.

When referring to embodiments of the invention, references to the "front" of the mounting system will refer to a side of the mounting system described herein that is intended for operator accessibility, while references to the "rear" of the mounting system will refer to the side of the mounting system that is normally not easily accessible to an operator.

In one embodiment, the system and method of the invention for mounting electronic equipment modules is used in an aircraft, and is attached to a mounting surface within the aircraft, such as the instrument panel. Although this setting is used as an example, the mounting system and method described can be used in other settings as well without departing from the scope of the invention.

FIG. 1 is a perspective view of an electronic equipment mounting system 100 according to an embodiment of the present invention. The mounting system 100 includes a mounting frame 102 having a pair of first mounting surfaces 104, each with a plurality of mounting holes 106 which permit a range of assembly along the vertical direction 108. The mounting frame 102 also includes a pair of second mounting surfaces 110, each with a plurality of mounting slots 112, that enable a range of assembly along the transverse direction 114. In the illustrated embodiment, pairs of mounting surfaces 104, 110 are shown on opposing sides of the mounting frame 102. One skilled in the art will recognize that other configurations for mounting will also be operative to secure various items to the frame 102 utilizing many known fastening methods and members.

A number of mounting racks 120 are shown as being inserted into mounting frame 102. Each mounting rack 120 includes a connector plate 122 removably and snapably attached to a rear of the mounting rack 120 as described in further detail below. In one embodiment, the connector plate 122 further includes one or more electrical connectors (not shown), such as a backplane pin connector. Each mounting rack 120 is attached to the second mounting surface 110 of the mounting frame 102 utilizing mounting slots 112 (hidden behind mounting flanges 124 of mounting racks 120).

The mounting racks 120 can be mounted along a range of mounting locations 114. The slots 112 of the second mounting surfaces 110 allow the mounting racks 120 to be positioned to one side or the other of the mounting frame 102. This configuration allows further flexibility in locating electronic modules (shown in FIG. 2), on a surface, such as a crowded cockpit instrument panel. Mounting rack 120 permits a variety of sizes and shapes of electronic modules to be mounted in various locations, within openings 126 of mounting racks 120 while maintaining ease of replacement, since the mounting racks 120 guide removal and replacement of the modules. The mounting racks 120 can also be configured with mechanical mechanisms 128 for quickly securing and releasing the modules from the mounting racks 120, as well as for making/breaking electrical connections as the modules are inserted and removed, respectively, from the mounting racks 120.

Figure 2:
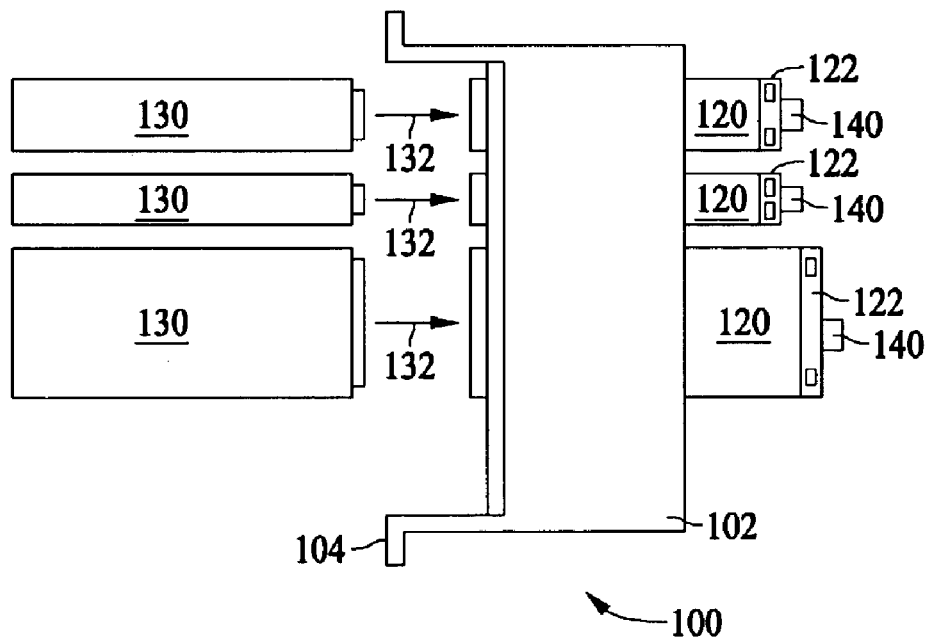
FIG. 2 is a top view depicting electronic equipment being inserted into the mounting system of FIG. 1.

FIG. 2 is a top view of mounting system 100 according to an embodiment of the invention. In addition, electronic equipment modules 130 are shown as being insertable into the openings 126 of, or slidably engagable with corresponding mounting racks 120 along the direction of the arrows 132. Such modules 130 can include, but are not limited to, various devices, such as a cellular telephone, an aircraft radio, a transponder, a global positioning system (GPS) receiver, a computer, engine monitoring circuitry, airframe monitoring circuitry, atmospheric monitoring circuitry, and/or other devices and equipment, such as a data acquisition system, which process information from sensors, acquire such information, and communicate the information in various forms. Further, electrical connectors 140 are shown extending from connector plates 122. As apparent from FIGS. 1 and 2, each mounting rack 120 is sized to accept a corresponding electronic equipment module 130.

Figure 3:
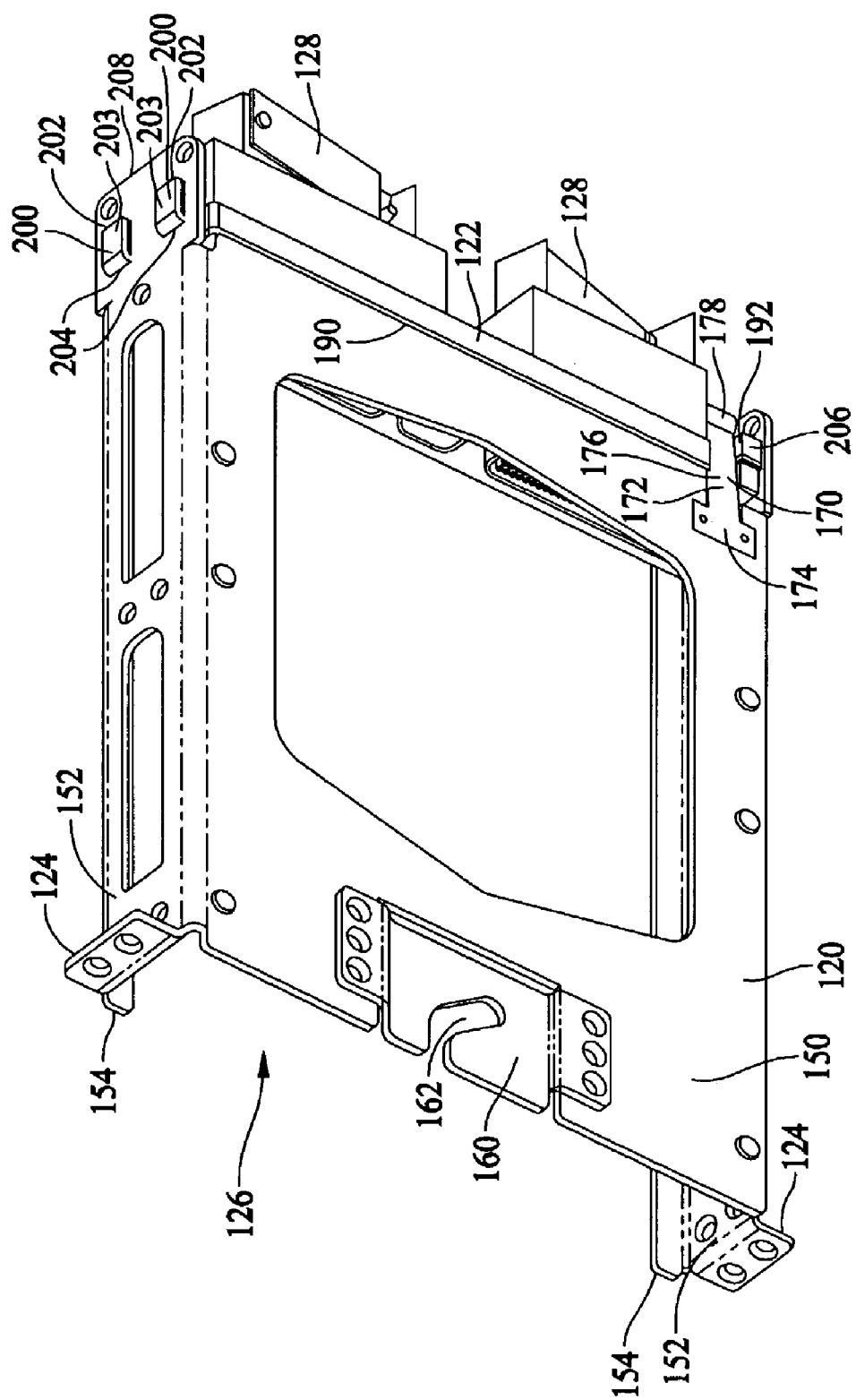
FIG. 3 is a bottomward view of a mounting rack and connector plate utilized to mount equipment in the mounting system of FIG. 1.

FIG. 3 illustrates one embodiment of a mounting rack 120 with a connector plate 122 attached thereto. The mounting rack 120 may be formed from sheet aluminum in one embodiment. The mounting rack 120 includes a base portion 150 and two side walls 152 extending up at substantially a right angle from the base portion 150. The side walls 152 includes flanges 154 extending along outer edges of the side walls 152. The flanges 154 face one another resulting in an opening 126 between the side walls. The base portion 150, side walls 152, and flanges 154 provide a channel or opening 126 for the insertion of electronic equipment 130 (shown in FIG. 2).

Attached to base portion 150 is an equipment retention plate 160, which includes an engaging slot 162 utilized in the retention of electronic equipment within mounting rack 120. Also attached to base portion 150 is a retention device 170, in one embodiment in the form of a spring clip 172, utilized to retain connector plate 122 against mounting rack 120. In the embodiment shown, spring clip 172 includes an attachment member 174 for attaching spring clip 172 to base portion 150. A body member 176 extends from attachment member 174 to clipping member 178 which engages connector plate 122. Clipping member 178 extends at an angle from body member 176. In one embodiment, spring clip 172 is fabricated from beryllium copper. Referring to connector plate 122, which may be fabricated from cast aluminum, a bottom portion 190 is formed with a channel 192, which body member 176 of spring clip 172 engages. As spring clip 172 engages channel 192, a side-to-side movement of connector plate 122, with respect to mounting rack 120 is reduced. In one embodiment, a slot (not shown) is formed in base portion 150 of mounting rack 120. This slot provides a channel into which a portion of body member 176 is located upon attachment of spring clip 172 to body portion 150. The slot further provides operator access to spring clip 172, allowing the operator to release connector plate 122 from mounting rack 120.

Connector plate 122 is also configured with one or more tabs 200 which extend from an end of connector plate 122. Tabs 200 further include a small protrusion 202 extending at a substantial right angle from an end 203 of the tabs 200. Tabs 200 and protrusions 202 are inserted into slots 204 formed in mounting rack 120, near a rear 208 of mounting rack 120 to form a hinge-like connection between the two, at an end 206 of connector plate 122 opposite from where spring clip 172 engages connector plate 122. Once connector plate 122 is inserted into slots 204, protrusions 202 engage the side wall 152, helping to reduce any likelihood that connector plate 122 will easily disengage from side wall 152.

Figure 4:
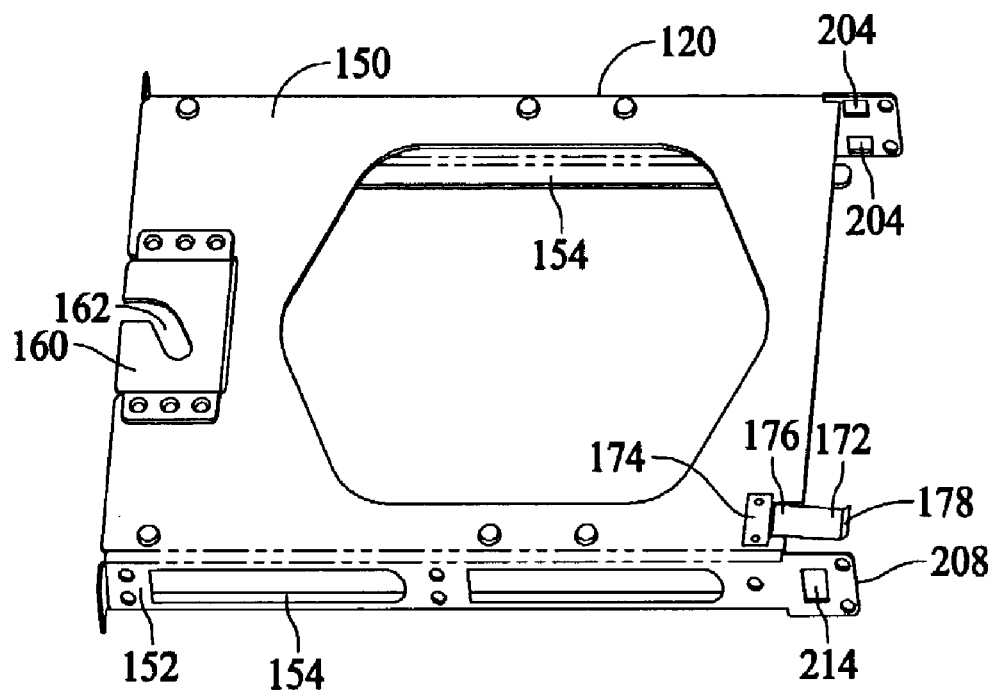
FIG. 4 is a view of the mounting rack of FIG. 3.

FIG. 4 is an illustration of mounting rack 120 which shows slots 204 as described above, and an opening 212 which is formed in an opposite side wall 152 of mounting rack 120 as slots 204.

Figure 5:
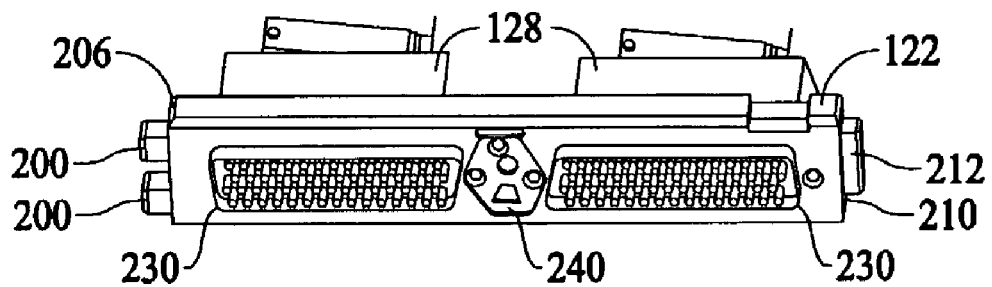
FIG. 5 is a view of the connector plate of FIG. 3.

FIG. 5 is an illustration of connector plate 120. An end 210 of connector plate 122 that is opposite from hinge forming end 206, in one embodiment, is formed with an extension 212 extending outward from end 210. referring to both FIGS. 4 and 5, extension 212 inserts into opening 214 as connector plate 122 engages mounting rack 120.

Connector plate 122, in the embodiment shown, includes two connectors 128 installed within connector mounting holes (not shown) that are formed in connector plate 122. Equipment engaging portions 230 of electrical connectors 128 protrude through the connector mounting holes extending past a front facing portion 232 of connector plate 122. While the commonly used "D-type" connectors are shown as connectors 128, other connector configurations are known to exist, and are contemplated to be able to be inserted into alternative embodiments of connector plate 122 configured to accept such connector configurations.

A electronic equipment keying plate 240 is also mounted onto connector plate 122. As further described below, connector keying plate 240 is utilized to ensure that electronic equipment that utilizes the same or similar connectors are not incorrectly inserted into an incorrect position of mounting system 100 (shown in FIG. 1). The keying plate 240 is illustrated as being screwed onto connector plate 122 utilizing screws 242, but other methods of attachment are contemplated, for example, riveting. In an alternative embodiment, keying plate 240 is molded as a portion of connector plate 122.

Figure 6:
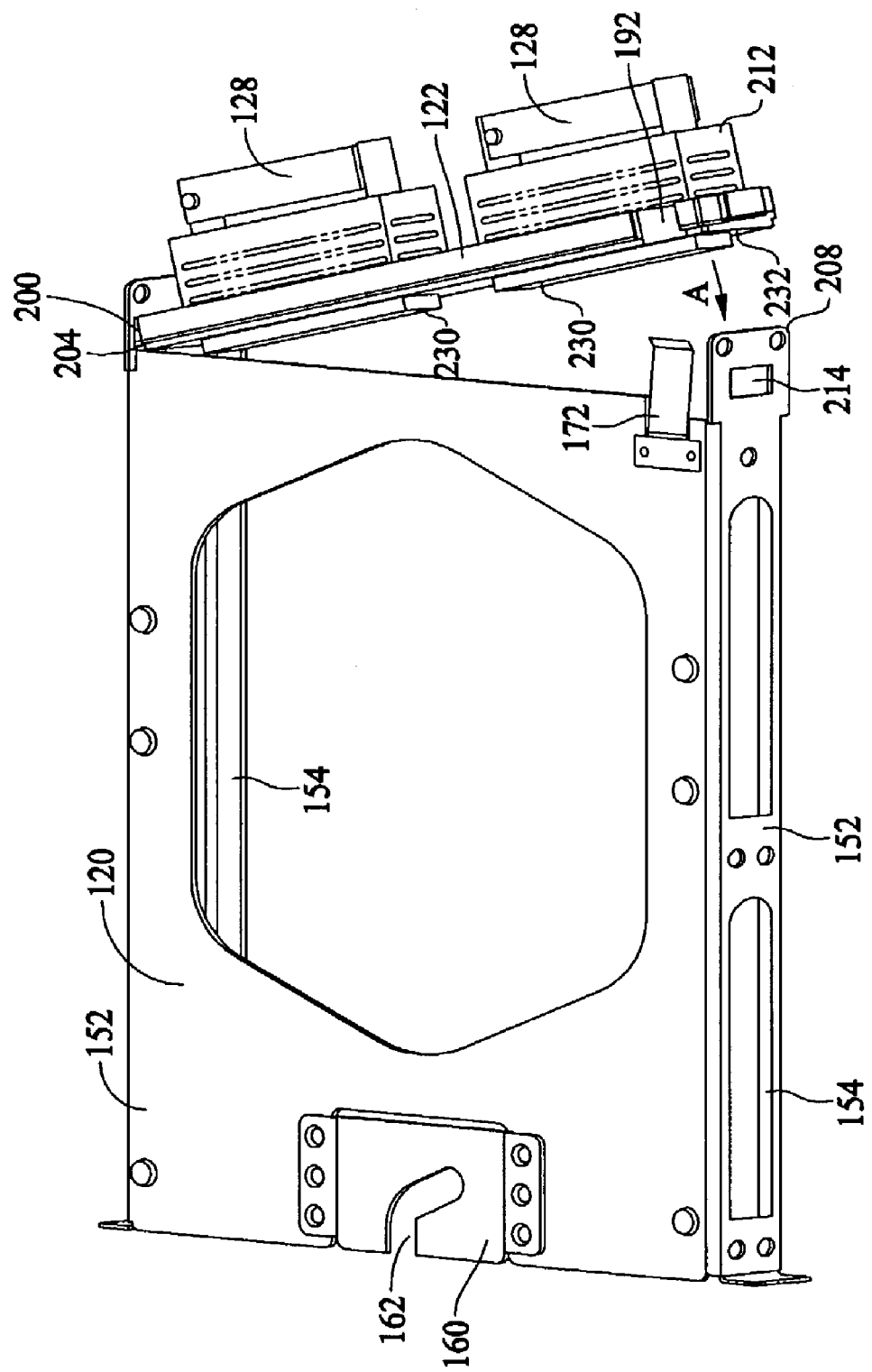
FIG. 6 is a view of the connector plate partially engaged with the mounting rack.

FIG. 6 is another bottom view of mounting rack 120 and connector plate 122. Tabs 200 of connector plate 122 have been inserted into slots 204. FIG. 6 further provides a view of the extension 212 extending from end 232 of connector plate 122 and the opening 212 in mounting rack 120 for the eventual insertion of extension 212. FIG. 6 also illustrates the hinging action of connector plate 122 which is provided through the insertion of tabs 200 into slots 204. Arrow A indicates the motion of connector plate 122, utilizing the hinging action provided by tabs 200 and slots 204 as connectors 128 mounted in connector plate 122 are engaged to a piece of electronic equipment (not shown in FIG. 5).

Insertion of tabs 200 into slots 204, subsequent insertion of extension 212 into opening 214, and engagement of spring clip 172 with connector plate 122 all combine to provide an essentially floating connector plate (e.g. connector plate 122) attached to mounting rack 120. By floating, it is meant that each point of engagement between mounting rack 120 and connector 122 has some freedom of movement. The floating attachment can possibly eliminate a need for alignment pins, which are used in other known connector plate arrangements, for aligning the electronic equipment connectors with their respective mating connectors mounted on the connector plate.

FIG. 6 also illustrates the channel 192 formed within the bottom portion 190 of connector plate 122. Channel 192 is provided so as to engage a portion of spring clip 172 when connector plate 122 is attached to mounting rack 120. Tabs 200, slots 204, extension 212, opening 214, and spring clip 172 provide an arrangement where no tools are necessary to install or remove connector plate 122 from mounting rack 120. Spring clip 172 holds connector plate 122 in position, fixing it in place substantially against a rear of mounting rack 120 such that connector plate 122 is not released out of slots 204 and opening 214 without disengaging spring clip 172 from connector plate 122.

Figure 7:
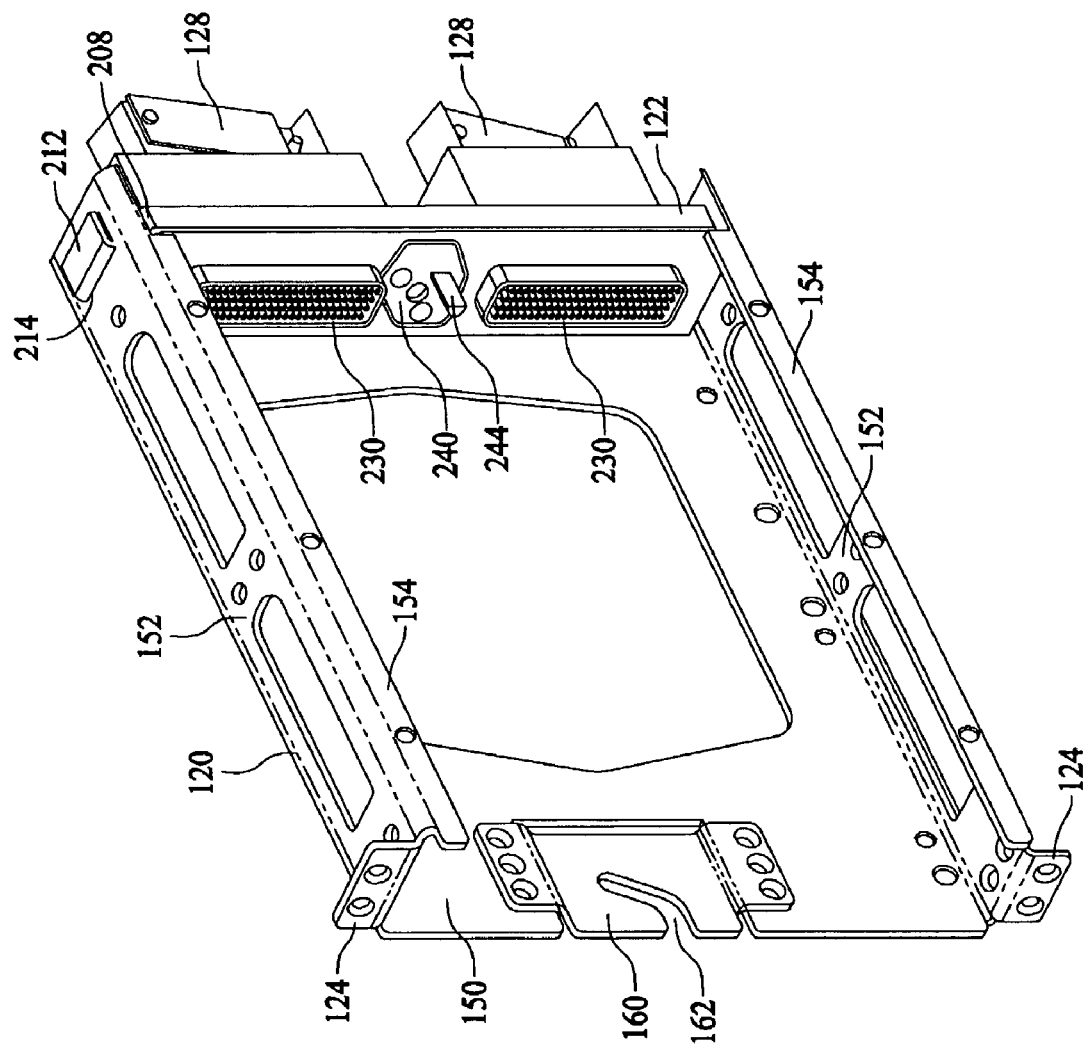
FIG. 7 is a view of the connector plate fully engaged with the mounting rack.

FIG. 7 illustrates connector plate 122 fully engaged with mounting rack 120 as extension 212 is inserted within opening 214. Not shown in FIG. 7 is spring clip 172 (shown in FIG. 3) engaging connector plate 122. As described above, engaging of connector plate 122 to mounting rack 120 results in a "floating" engagement between mounting rack 120 and connector plate 122 as there is no inflexible connection between the two.

A key 244 is shown extending from keying plate 240. Key 240 has a specific geometric shape and a corresponding, mating geometric shape is incorporated into electronic equipment that is intended to mate with the specific electrical connectors 128 that are mounted into connector plate 122. Utilization of key 244 and the corresponding, mating shapes within the electronic equipment is intended to prevent insertion of electronic equipment into the combination of mounting rack 120 and connector plate 122 when the signals at the individual pins 230 of connectors 128 are not compatible with the signals at the individual mating connector pins (not shown) of the electronic equipment.

The above described embodiments provide a connector plate 122 which "floats" when installed against a mounting rack 120. The connector plate 122 can be installed and removed without having to utilize any tools, simplifying installation of electronic equipment where there is limited access and maneuvering room for an installer of such electronic equipment, for example, within an aircraft. Connector plate 122 can be released from mounting rack 120 by simply releasing the spring clip 172 which acts to retain the connector plate 122 against the mounting rack 120. The arrangement therefore provides an advantage to known mounting rack designs where a connector plate is attached to a mounting rack by screws or similar attachment means which require tool access for installation and removal. Further, the "floating" arrangement of the connector plate 122 with respect to mounting rack 120 is thought to reduce or eliminate a need for alignment pins which are used in known electronic equipment mounting configurations to align the equipment with the connectors mounted in a connector plate.

While the invention has been described in terms of various specific embodiments, those skilled in the art will recognize that the invention can be practiced with modification within the spirit and scope of the claims.

What is claimed is:

1. A mounting system for electronic equipment comprising:
   a mounting rack;
   a connector plate removably mounted to a rear end of said mounting rack, said connector plate being configured to join and support electronic equipment; and
   a retention device removably holding said connector plate against said rear of said mounting rack, wherein said retention device comprises means for snapably holding said connector plate against said mounting rack.

2. A mounting system according to claim 1 wherein said retention device comprises a spring clip attached to said mounting rack, said spring clip engaging said connector plate.

3. A mounting system according to claim 1 wherein said connector plate comprises an extension extending from one end of said connector plate.

4. A mounting system according to claim 1 wherein to mount said connector plate to said mounting rack, said connector plate comprises one or more tabs extending therefrom and said mounting rack comprises one or more slots for insertion of corresponding said tabs.

5. A mounting system according to claim 1 wherein said retention device and the mounting of said connector plate to said mounting rack combine to substantially prevent a side-to-side movement of said connector plate with respect to the end of said mounting rack.

6. A mounting system according to claim 1 wherein said retention device comprises a spring clip and said connector plate comprises a recess which engages said spring clip to minimize a side-oside movement of said connector plate with respect to the rear of said mounting rack.

7. A mounting system according to claim 1 wherein said mounting rack comprises an inside portion and an outside portion, said retention device accessible from both said inside portion and said outside portion of said mounting rack.

8. A mounting system according to claim 1 wherein said connector plate comprises a first end and a second end and one or more tabs extending from said first end and at least one extension extending from said second end, said mounting rack comprises one or more slots for insertion of said tabs, said tabs extending from said first end hingedly mounting said connector plate to said mounting rack, said extension extending from said second end and engaging said mounting rack.

9. A mounting system according to claim 1 wherein said connector plate comprises a first end and one or more tabs extending from said first end, said mounting rack comprising one or more slots for insertion of said tabs, said tabs further comprising a protrusion at an angle from said tabs, said protrusions acting to retain the mounting of said connector plate to said mounting rack.

10. A mounting system according to claim 1 wherein said connector plate comprises a keying member attached thereto.

11. A mounting system according to claim 1 wherein said connector plate comprises:
   one or more tabs extending from a first end of said connector plate; and
   an extension extending from a second end of said connector plate, said mounting rack comprising one or more slots for insertion of said tabs and an opening for insertion of said extension.

12. A mounting system according to claim 1 wherein said mounting rack comprises:
   a base portion; and
   two side walls extending from said body portion at a substantial right angle, one of said side walls comprising a opening approximate a rear of said side wall for engaging an extension extending from said connector plate, another of said side walls comprising one or more slots for engaging tabs extending from said connector plate.

13. A mounting system according to claim 1 further including a connector installed within a mounting hole of said connector plate.

14. A mounting system according to claim 11 wherein said tabs and said extension provide a floating engagement of said connector plate to said mounting rack.

15. A mounting system for electronic equipment comprising:
   a mounting rack;
   a connector plate removably mounted to a rear end of said mounting rack;
   a connector installed within the connector plate; and
   a retention device removably holding said connector plate against said rear of said mounting rack, wherein said retention device comprises a spring clip attached to said mounting rack, said spring clip engaging said connector plate.

16. A mounting system according to claim 15 wherein said retention device comprises means for snapably holding said connector plate against said mounting rack.

17. A mounting system according to claim 15 wherein said retention device comprises a spring clip and said connector plate comprises a recess which engages said spring clip to minimize a side-to-side movement of said connector plate with respect to the rear of said mounting rack.

18. A mounting system according to claim 15 wherein said connector plate comprises a first end and a second end and one or more tabs extending from said first end and at least one extension extending from said second end, said mounting rack comprises one or more slots for insertion of said tabs, said tabs extending from said first end hingedly mounting said connector plate to said mounting rack, said extension extending from said second end and engaging said mounting rack.

19. A mounting system according to claim 15 wherein said connector plate comprises a first end and one or more tabs extending from said first end, said mounting rack comprising one or more slots for insertion of said tabs, said tabs further comprising a protrusion at an angle from said tabs, said protrusions acting to retain the mounting of said connector plate to said mounting rack.

20. A mounting system according to claim 15 wherein said connector plate comprises a keying member attached thereto.

21. A mounting system according to claim 15 wherein said connector plate comprises:
   one or more tabs extending from a first end of said connector plate; and
   an extension extending from a second end of said connector plate, said mounting rack comprising one or more slots for insertion of said tabs and an opening for insertion of said extension.

22. A mounting system according to claim 15 wherein said mounting rack comprises:
   a base portion; and
   two side walls extending from said body portion at a substantial right angle, one of said side walls comprising a opening approximate a rear of said side wall for engaging an extension extending from said connector plate, another of said side walls comprising one or more slots for engaging tabs extending from said connector plate.

23. A mounting system according to claim 21 wherein said tabs and said extension provide a floating engagement of said connector plate to said mounting rack.

* * * * *